United States Patent [19]

Gell

[11] Patent Number: 4,959,694
[45] Date of Patent: Sep. 25, 1990

[54] SEMICONDUCTOR HETEROSTRUCTURES WITH SIGE MATERIAL

[75] Inventor: Michael A. Gell, Ipswich, England

[73] Assignee: British Telecommunications public limited company, England

[21] Appl. No.: 288,828

[22] Filed: Dec. 23, 1988

[30] Foreign Application Priority Data

Dec. 23, 1987 [GB] United Kingdom ................. 8729953
Mar. 28, 1988 [GB] United Kingdom ................. 8807350
Jul. 27, 1988 [GB] United Kingdom ................. 8817884
Aug. 25, 1988 [GB] United Kingdom ................. 8820150

[51] Int. Cl.$^5$ ........................................... H01L 29/165
[52] U.S. Cl. ........................................ 357/16; 357/4; 357/61
[58] Field of Search ............................... 357/4, 16, 61

[56] References Cited

U.S. PATENT DOCUMENTS

| | | | |
|---|---|---|---|
| 3,626,257 | 12/1971 | Esaki | 357/4 |
| 3,872,400 | 3/1975 | Clausecker | 357/4 |
| 4,529,455 | 7/1985 | Bean et al. | 357/4 |
| 4,620,206 | 10/1986 | Ohta et al. | 357/4 |
| 4,644,378 | 2/1987 | Williams | 357/4 |
| 4,661,829 | 4/1987 | Bean et al. | 357/4 |
| 4,772,924 | 9/1988 | Bean et al. | 357/4 |
| 4,814,837 | 3/1989 | Kirchoefg324 7 | 357/16 |

FOREIGN PATENT DOCUMENTS

0124924 11/1984 European Pat. Off. ................. 357/4
0224189 6/1987 European Pat. Off. ................. 357/4

OTHER PUBLICATIONS

Soviet Technical Physics Letters, vol. 23, No. 6, Jun. 1987, American Institute of Physics, (New York, US), A. A. Kostenko et al: "Conversion of Submillimeter Electromagnetic Signals in a Ge-Ge$_{1-x}$Si$_x$ Superlattice"—p. 305.
Journal of Vacuum Science & Technology, Section B. vol. 5, No. 4, Jul./Aug. 1987, American Vacuum Society (Woodbury, NY US), J. Bevk et al: Summary Abstract: "Structural Analysis of Ultrathin Epitaxial Ge/Si Films on Si(100)" pp. 1147–2249.
Proceedings of the First International Symposium on Silicon Molecular Beam Epitaxy (New Jersey, US), P. Eichinger et al: "Characterization of MBE Grown SIGE Superlattices with SIMS and RBS".
Physical Review B: Condensed Matter, vol. 32, No. 2, Jul. 1985 pp. 1027–1036, The American Physical Society Woodbury, NY, US; S. Krishnamurthy et al: "Electronic Structure and Impurity-Limited Electron Mobility of Silicon Superlattices" p. 1028.
Proceedings of Electrochemical Society, 1985, 85-7, pp. 367–375, GB; P. Eichinger et al: "Characterization with SIMS and RBS".
Electronics Letters, vol. 22, No. 25, 17th Jul. 1986, pp. 819–821, Stevenage, Herts, GB; L. Friedman et al: "Linear Electro-Optic Effect in Ge$_x$Si$_{1-x}$/Si Strained-Layer Superlattices".
Applied Physics Letters, vol. 49, No. 5, 4th Aug. 1986, pp. 286–288, American Institute of Physics, Woodbury, New York, US; J. Bevk et al: "Ge-Si Layered Structures: Artificial Crystals and Complex Cell Ordered Superlattices".
Satpathy, et al, Electronic Properties of the (100) (SI)/(Ge) Strained-Layer Superlattices–Phys. Rev B. vol 38, (1988) p. 13237.
Hybertsen et al, Theory of Optical Transitions in Si/Ge (001) Strained-Layered Superlattices–Phys. Rev. B vol. 36, No. 18, pp. 9863-9693.
Bevk et al, Structure and Optical Properties of Ge-Si (List continued on next page.)

*Primary Examiner*—Jerome Jackson, Jr.
*Attorney, Agent, or Firm*—Nixon & Vanderhye

[57] ABSTRACT

A semiconductor device comprises a short-period superlattice of alternating monolayers of silicon and germanium grown on a 100 oriented SiGe substrate including 60-95% Ge. The silicon layers are M monolayers thick, and the germanium layers are N monolayers thick, where $M = 2(2m+1)$ for $m\delta 0$, 1 or 2 (preferably 0) and $N = 2(2n+1)$, $n = 1,2,3,4,5,6$ etc. "Inhomogeneous" superlattices in which successive Ge layers have thicknesses N1, N2, N3 etc. (selected from the above N values) are disclosed.

23 Claims, 2 Drawing Sheets

OTHER PUBLICATIONS

Ordered Superlattices–Appl. Phys. Letter 50(12), Mar. 23, 1987 pp. 760–762.

Pearsall et al, Structurally Induced Optical Transitions in Ge–Si Superlattices–Physical Review Letters vol. 58, No. 7, (16/2/87) pp. 729–732.

Pearsall, et al–Optical Properties of Ordered Ge–Si Atomic Layer Superlattices–Conf. Paper–MRS Spring Meeting (Apr. 21–24, 1987).

Gmitzmann et al–Theory of Direct Optical Transitions in an Optical Indirect Semiconductor with a Superlattice Structure–Appl. Physics 3, pp. 914 (1974).

Zachai et al–Band Structure and Optical Properties of Strain Symmetrized Short Period Si/GE Superlattice on Si(100) Substrates–Proc. Semicond Conf., Warsaw, Aug. 1988.

R. People et al–Optoelectronic Properties of Pseudomorphic $Si_xGe_{1-x}$/Ge Heterostructures on (001) Ge–Mat. Res. Soc. Symp., 91, 299 (1987).

R. People et al–Indirect, Quasidirect and Direct Optical Transitions in the Pseudomorphic (4×4) Monolayer Si–Ge Strained Layer Superlattice on Si(001)–Phys. Rev. B 36, 1310 (1987).

Froyen et al–New Ordering-Induced Optical Transitions in Strained SiGe Superlattices–Mat. Res. Soc. Symp., 91, 293 (1987).

Pearsall et al–Optical Properties of Ordered Ge–Si Atomic Layer Superlattices–Mat. Res. Soc. Symp., 91, 287 (1987).

Hybertson and Schluter–Theory of Optical Transitions in $Si_nGe_n$ (001) Strained Layer Superlattices–Mat. Res. Soc. Symp., 102, 413 (1988).

Ikeda et al–Electronic Structure Calculations of $(Si)_m/(Ge)_n$ Strained Layer Superlattices–Semiconductor Conference, Warsaw, Aug. 1988.

Shen et al–Electronic Structures of Strained-Layer Superlattices $(Si)_{2n}/(Si_{1-x}Ge_x)_{2n}(100)$ With n=1-10–Appl. Phys. Let. 52,717 (1988).

Shen et al–Tight-Binding Study of the Strained Monolayer Superlattices $(Si)_1/Si_{1-x}Ge_x)_1(100)$–Apply Phys. Letter 52, 1599 (1988).

Pearsall et al.–Ge–Si/Si Infra-Red Zone-Fold Superlattice Detectors–Electronic Letters, 24, 685 0 (1988).

… … …

SEMICONDUCTOR HETEROSTRUCTURES WITH SIGE MATERIAL

BACKGROUND AND SUMMARY OF THE INVENTION

This invention relates to semiconductor heterostructures comprising alternating sets of layers of Silicon and Germanium (or SiGe alloys), at least one set of layers being sufficiently thin as to be in a state of elastic strain, so as to define a coherent short period superlattice. Particularly, but not exclusively, this invention relates to quasi direct band gap heterostructure devices of this kind suitable for use as light emitting devices.

Superlattices, that is, heterostructure devices comprising alternating layers of materials with differing band gaps sharing a common lattice structure, are well-known and used in the art. Where the materials comprising the alternating layers have substantially different lattice parameters, one of two situations inevitably obtains; either dislocations are generated at the interface between layers, or (if, and only if, one set of layers is sufficiently thin) one or both sets of layers may exist in a permanent state of elastic strain.

In the AlGaAs system, the mismatch between alternating layers is virtually zero, but this is not the case with Silicon and Germanium where the lattice mismatch is about 4%. This would lead to the presence of a substantial number of dislocations in conventional (long-period) superlattice structures, and since dislocations act as (and generate further) re-combination sites, such superlattices are useless for a great number of applications. There has therefore been considerable interest in the possibility of ultra-thin Silicon/Germanium superlattices, and these have been theoretically discussed for over a decade. It is only very recently, however, that manufacturing techniques have permitted the deposition of such fine layers (typically comprising one to thirty monolayers of atoms) as are necessary to produce layers which will remain in elastic strain. Further, the fine structure of such superlattices have hitherto been extremely difficult to characterise - in other words, having made such a structure, it is often not possible to tell what the structure is.

Early theories also neglected the (crucial) effect of strain on the electronic band structure of the strained layers.

There have thus been several differing theoretical models of how such structures should behave - but since experimental evidence is not generally available, such theories are of little practical guidance. Furthermore, because of the nature of the models used, even a theoretical prediction of the properties of a given structure may take days of computing time and place heavy demands on computer hardware. We have now discovered criteria that make possible the realisation of a new class of heterostructure devices.

According to the invention there is provided a semiconductor device comprising a short-period superlattice of alternating layers of first and second materials of different compositions within the Si/Ge system grown epitaxially on an (100) oriented substrate, the silicon layers being M monolayers thick, the germanium layers being N monolayers thick, M being smaller than N.

Preferably, the first material is Silicon and the second material is Germanium.

Preferably, $M = 2(2m+1) + x$, and $N = 2(2n+1) - x$ where $x = 0$ or $1$, $m = 0, 1$ or $2$ and n is an integer. In a specific preferred embodiment, $M = 2$ and $N = 6$.

Alternatively, $M = 3$ and $N = (4n+1)$, where n is an integer greater than 1.

In one embodiment, the substrate is the device substrate.

Alternatively, the substrate is a buffer layer epitaxially formed on the device substrate. The substrate may consist essentially of GaAs, or of $Si_{1-x}Ge_x$, where $0.5 < x < 1$, and preferably $0.6 \leq x < 1-$. In this latter embodiment, the ratio of M:N approximates the ratio of Silicon to Germanium in the substrate. N values of at least some successive second material layers need not be equal.

According to one aspect of the invention, devices capable of emitting light in a directional coplanar with the layers are provided.

Although both Si and Ge are indirect bandgap materials in bulk, SiGe superlattices may be sufficiently quasi-direct to be of use as device-quality light emitting structures (that is, their optical matrix elements may approach—within a few orders of magnitude—those of a direct bandgap material).

According to another aspect of the invention, there is provided a light emitting device as recited above.

Such structures have the advantage of good compatability with existing S-based VLSI technology and potentially lower materials costs than GaAs systems.

BRIEF DESCRIPTION FO THE DRAWINGS

The structure of devices according to the invention will now be described, together with some underlying theoretical concepts, with reference to the drawings, in which.

Figure 3:
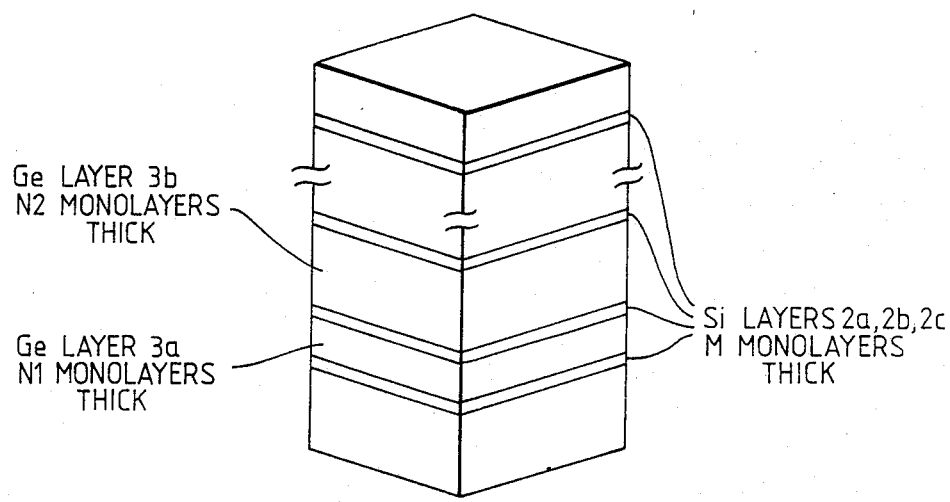

FIG. 3 FIG. 3 shows schematically a superlattice structure according to one aspect of the invention.

DETAILED DESCRIPTION OF THE DRAWINGS

Figure 1:
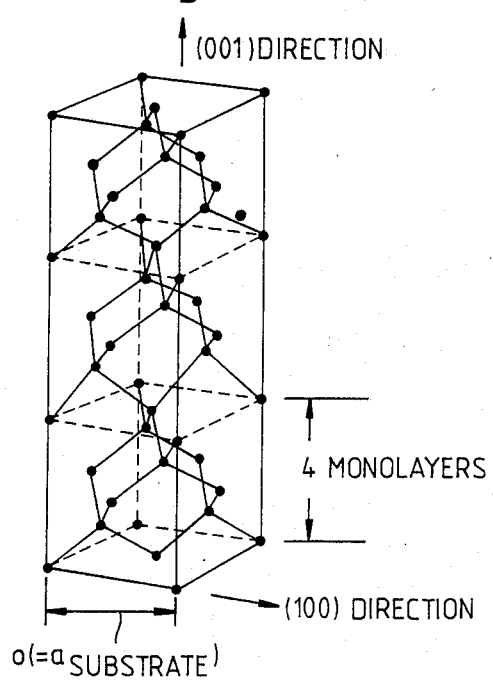
FIG. 1 illustrates the lattice structure of bulk Si or Ge in an (001) direction.

Referring to FIG. 1, Silicon and Germanium both form diamond cubic lattices. When viewed along cube (001) directions, each cell of the lattice may therefore be considered to comprise 4 atomic monolayers at spacings of a/4, where a is the lattice parameter.

Since a for Si is 5.43 Å and a for Ge is 5.65 Å there is thus a mismatch of around 4% between the two lattices, and in a short-period superlattice, this must be accommodated as elastic strain by one or both sets of layers.

Figure 2:
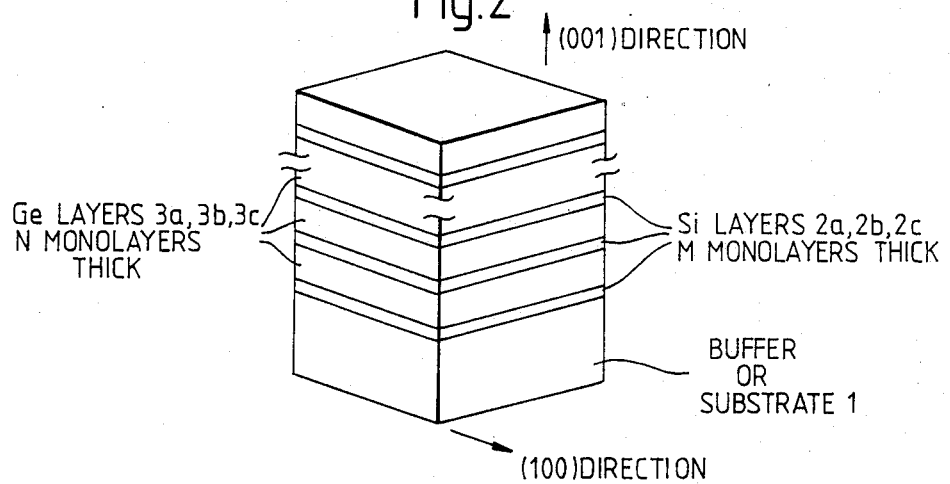
FIG. 2 illustrates schematically a short-period Si/Ge superlattice structure.

Referring to FIG. 2, a practical short-period superlattice device comprises an (001) oriented substrate 1, with alternating epitaxial layers of a first material (shown as Si), M monolayers thick (2a, 2b, 2c etc) and of a second material (shown as Ge), N monolayers thick (3a, 3b, 3c etc). In prior proposals, the substrate is typically Si and N is equal to M.

Such devices are preferably made using MBE, as described (for example) in "Silicon Molecular Beam Epitaxy 1984–1986", J. C. Bean, J. Crystal Growth 81, 411 (1987).

The first effect of the substrate, or buffer, layer 1 is to dictate the distribution of elastic strain; if the buffer is Ge, the adjacent Si layer 2a and subsequent Si layers 2b, 2c are forced to take the bulk Ge lattice constant in the (100) and (010) directions, whereas the Ge layers 3a, 3b, 3c are unstrained. If the substrate is Si, the converse is true, and an SiGe substrate causes a distribution of strain between the Si and Ge layers (it is of course much simpler and cheaper to use a pure substrate, especially pure Si, so this is the approach favoured in the prior art). The lattice spacings along the superlattice axis (the (001) direction) are to a good approximation, determined simply from the elastic response of the individual Si and Ge bulk lattices.

A limit on the maximum size along the superlattice (001) axis of device which can be fabricated may also be imposed by the buffer layer composition. We have realised that if the relative proportions of Si and Ge in the buffer equate to their relative proportions (i.e. the ratio of M to N) in the superlattice, then the strain is distributed symmetrically between the Si and Ge layers and devices can be grown to any desired size. If the strain is not distributed symmetrically (as is, of course, always the case with pure Si or Ge buffers), only relatively short superlattice regions comprisign a small number of successive layers can be produced.

We have also realised that, where use of a high-Ge buffer is thus indicated, a GaAs buffer may be substituted (as a=5.65 Å).

The effect of strain of this kind is to lower the symmetry of the lattice as a whole (it is no longer cubic) and thus produce splittings of otherwise degenerate states and modify optical selection rules. Also, new optical transistions, intrinsic to the superlattice structure, may arise through momentum-mixing.

We have found that SiGe superlattices are well-modelled by a theory based on empirical local atomic pseudopotentials with spin-orbit coupling.

The first requirement for a device exhibiting good optical properties is that the transition probability for the lowest energy cross-gap transition be high (comparable, for example, with the direct zone-centre transition in GaAs). We have discovered a systematic correlation between P (related to the transition probability, and defined as $\log_{10}|L|^2$ where L is the optical dipole matrix element) and the value of M (the thickness in monolayers of the Si layers); for a given value of N (the thickness of the Ge layers), P has maxima at M=2, 6, 10 ..., in other words, M=2(2 m+1) where m=0, 1, 2, etc. We have further found that the highest transition probability is obtained for M=2; this is therefore a preferred feature of the invention.

We have also discovered that N obeys a similar "selection principle"; values of N which give (i) a high transition probability and (ii) have the global minimum in the superlattice conduction band at the centre of the superlattice Brillouin zone, are N=2(2 n+1) where n=1, 2, 3 ..., and N<>M.

Preferred embodiments of the invention within these criteria are 2:6, 2:10, 2:14, 2:18 and 2:22 structures (all of which have demonstrated good optical properties), for reasons discussed hereinafter, although 2:26 etc structures are also within the scope of the invention.

The superlattice structure causes "zone-folding" - that is, when represented in momentum-state (k) space, states near the bulk Brillouin Zone edge map back towards the centre of the superlattice Brillouin zone. Depending on the folding, this can result in off-centre states having lower energy levels, and hence an indirect bandgap material. We have discovered, however, that the composition of the buffer layer 1 plays a crucial part in determining this aspect of zone-folding; specifically, when the buffer layer includes more than about 20% Ge, these superlattices can become quasi-direct and hence be suitable for light emission. The buffer layer does not play a crucial role in determining the optical transition probability, but it does alter the transition energies (and hence the wavelength of light which could be emitted).

The composition of the buffer (or substrate) layer 1 also affects other aspects of the superlattice band structure. For the case of a Si buffer (or substrate), only the Ge layers are under tetragonal distortion and the top bulk Ge zone-centre valence state is a $m_J=3/2$ state. For the case of a Ge buffer, only the Si layers are under tetragonal distortion and the top bulk Si zone-centre valence state is a $m_J=\frac{1}{2}$ state. Thus, a change in the buffer layer composition leads to substantial changes in the bandstructures of the Si and Ge layers. In structures according to the invention, the effective heavy-hole-like barrier remains constant for all SiGe buffer compositions, but the effective light-hole-like (strictly light-hole/split-off-like) barrier drops (from about 0.7 eV to 0.3 eV) in going from a Si to a Ge buffer. This substantial drop in the effective light-hole-like barrier, coupled with the relative positions of the zone-centre bulk valence states, forces the $m_J=\frac{1}{2}$ zone-centre superlattice state to anticross the $m_J=3/2$ state, or, at any rate, substantial mixing between the states occurs—at high Ge concentrations (above 60%, but related to the superlattice M:N ratio).

This cross-over manifests itself in a change in optical properties; for example, in a 4:4 structure the squared matrix element for the V2–C5 transition, with (001) polarisation drops typically by about three orders of magnitude after the crossing. This is a reflection of the decrease in $p_Z$-like components in the wavefunction of state V2 with increasing Ge concentration in the buffer layer. The corresponding drop in the value of the matrix element for the V1–C5 transition in going from (110) to (001) polarisation on a Si buffer is much less, a reflection of the strong heavy-light hole mixing which is occurring in the superlattice.

The anticrossings described here occur generally in SiGe superlattices; for a fixed period, the Ge concentration at which the hole states cross decreases as the ratio of M:N (the ratio of the width of the Si and Ge layers) increases.

This 'hole reversal' has considerable significance for the optoelectronic device designer. Where light is emitted, it is usually emitted only in the TE modes, with (110) polarisation, and thus emission occurs only along the superlattice axis. However, if the device is formed on a buffer (or substrate) having a sufficiently high Ge concentration (above around 60%) so as to exhibit 'hole reversal', or significant mixing between the uppermost valence states, light may be emitted in both TE and TM modes - in other words, light may also be emitted transversely to the superlattice axis. This clearly has many device applications, and gives the designer greater flexibility in, for example, allowing sideways coupling (parallel to the substrate) to other optoelectronic devices.

We have further discovered that it is not always necessary that successive Silicon or Germanium layers should have an equal thickness. Referring to FIG. 3, in the preferred embodiment of the invention in which M=2, and N is selected from the set 6, 10, 14, 18 ..., it is possible to fabricate "inhomogeneous" superlattice structures of the type (... 2:N1, 2:N2, 2:N3, 2:N4, ...), where N1, N2, N3 etc are not necessarily all different, and these will also be quasidirect. Clearly, the availability of a myriad of such structures gives the device engineer considerable freedom in tailoring electronic properties.

A different class of devices may be produced by fabricating a series of superlattice regions, SL1, SL2, SL3..., (where SL1 etc are each short-period superlattices of limited extent along the superlattice axis) one atop (or indeed orthogonal to) the other. The superlattices SL1, SL2, etc, are separated by intermediate buffer layers, which will not necessarily all have the same composition.

The method of manufacturing devices according to the invention will now be briefly described. It is usually convenient, if for example the device is to be formed on a common substrate with others, to use a substrate of Silicon (or Germanium). On this substrate, a buffer layer of the desired SiGe composition is formed epitaxially by any convenient deposition process. Since the buffer will not, in preferred embodiments, have the same lattice parameter as the substrate, it will either (if over a critical thickness related to its composition) be "relaxed", that is, have dislocations at its interface with the substrate, or (if under the critical thickness) elastically strained. Since it is difficult to trap dislocations at the buffer substrate interface, it is in general preferable to grow a strained buffer layer of less than the critical thickness (around a hundred to a few thousand Å)—a thickness easily achieved with current technology. Molecular beam epitaxy (MBE) is thereafter used to grow subsequent layers of Silicon and Germanium coherently upon the buffer layer.

Fabrication using MBE is unlikely to produce perfect monolayers, of course; references throughout the foregoing to monolayers and layer thickness will be understood to include approximations thereto which achieve the intended technical effect.

In fact, we predict that certain 3:N structures (where $N=2(2n+1)-1$), whilst less inherently quasi-direct than 2:N structures, are also sufficiently quasi-direct to be useful as light emitting devices. The N values will approximate those given above, so that the conduction band states disperse upwards (or, at any rate, do not significantly disperse downwards) in the superlattice Brillouin zone - specifically, 3:5, 3:9, 3:13, 3:17, 3:21 etc are quasidirect (for symmetry, it will be noted that $N=2(2n+1)-1=4n+1$).

Furthermore, it will be understood that although the alternating layers have been described as Si and Ge, in practice a superlattice could be realised using SiGe alloys for one or both sets of layers (provided that the alloy compositions differ sufficiently from layer to layer)—although this requires more complex process technology. The invention accordingly extends to encompass alternating SiGe alloy layers, as well as pure Si and Ge.

Although the invention is principally directed to providing superlattices which are sufficiently quasi-direct to act as light emissive optoelectronic devices, it will also be understood to include devices suitable for use as, for example, photodetectors (which may be indirect).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

I claim:

1. A semiconductor device comprising a short-period superlattice of alternating layers of first and second materials of different compositions within the Si/Ge system grown epitaxially on an (100) oriented substrate, the first material layers containing substantially more silicon than the second, the first material layers being M monolayers thick, the second material layers being N monolayers thick, M being smaller than N.

2. A semiconductor device according to claim 1, wherein the first material is Silicon and the second material is Germanium.

3. A device according to claim 1 or claim 2, in which $M=2(2m+1)+x$, and $N=2(2n+1)-x$ where $x=0$ or 1, $m=0$, 1 or 2 and n is an integer.

4. A semiconductor device as clamed in claim 3, wherein $M=2$.

5. A device according to claim 1 or claim 2, in which $N=6$.

6. A semiconductor device as claimed in claim 3 wherein $0<n<6$.

7. A semiconductor device as claimed in claim 6, wherein $0<n<5$.

8. A semiconductor device as claimed in claim 3, wherein n lies in the range of from 6 to 10.

9. A device according to claim 3, in which $M=3$ and $N=(4n+1)$, where n is an integer greater than 1.

10. A semiconductor device according to claim 1 further comprising a buffer layer epitaxially formed on the device substrate on which said alternating layers are grown.

11. A semiconductor device according to claim 1 or claim 10, in which the substrate consists essentially of GaAs.

12. A semiconductor device according to claims 1 or 10, in which the substrate consists essentially of $Si_{1-x}Ge_x$, where $0.5<x<1$.

13. A semiconductor device according to claim 12, wherein $0.6 \leq x < 1$.

14. A semiconductor device according to claim 13, wherein the ratio of M:N approximate the ratio of Silicon to Germanium in the substrate.

15. A semiconductor device according to claim 1 or claim 2, in which N values of at least some successive second material layers are not equal.

16. A semiconductor device as in claims 1 or 2 which is quasi-direct bandgap device.

17. A semiconductor device as in claim 16 which is a light emmitting device.

18. A light emitting device according to claim 17, capable of emitting light in a direction coplanar with the layers.

19. A semiconductor device as claimed in any one of claim 1 or claim 2, configured as an optical detector.

20. A semiconductor device as in claim 1 or 2 wherein $M=2$.

21. A semiconductor device as in claim 12 which is a quasi-direct bandgap device.

22. A semiconductor device as in claim 13 which is a quasi-direct bandgap device.

23. A semiconductor device as in claim 14 which is a quasi-direct bandgap device.

* * * * *